(12) United States Patent
Tan et al.

(10) Patent No.: US 11,330,725 B2
(45) Date of Patent: May 10, 2022

(54) HOUSING

(71) Applicant: KAWASAKI JUKOGYO KABUSHIKI KAISHA, Kobe (JP)

(72) Inventors: Haruhiko Tan, Kobe (JP); Shota Tominaga, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 136 days.

(21) Appl. No.: 16/763,693

(22) PCT Filed: Oct. 26, 2018

(86) PCT No.: PCT/JP2018/039962
§ 371 (c)(1),
(2) Date: May 13, 2020

(87) PCT Pub. No.: WO2019/102792
PCT Pub. Date: May 31, 2019

(65) Prior Publication Data
US 2020/0375042 A1 Nov. 26, 2020

(30) Foreign Application Priority Data

Nov. 24, 2017 (JP) .............................. JP2017-225869

(51) Int. Cl.
*H05K 5/00* (2006.01)
*H01R 11/01* (2006.01)
(Continued)

(52) U.S. Cl.
CPC ............ *H05K 5/0026* (2013.01); *H01R 11/01* (2013.01); *H05K 5/0217* (2013.01); *H05K 5/03* (2013.01); *H05K 7/1427* (2013.01)

(58) Field of Classification Search
CPC ...... H05K 5/0026; H05K 5/0217; H05K 5/03; H05K 7/1427; H05K 7/1432; H05K 5/0239; H01R 11/01; H01R 12/71; H01R 13/71
See application file for complete search history.

(56) References Cited

U.S. PATENT DOCUMENTS 5,914,845 A * 6/1999 Chase .................... H02H 9/042
361/111
6,178,359 B1   1/2001 Dobyns
(Continued)

FOREIGN PATENT DOCUMENTS

| JP | H11-306915 A | 11/1999 |
|----|--------------|---------|
| JP | H11-330715 A | 11/1999 |

(Continued)

OTHER PUBLICATIONS

Translation of JP 2004153219 (Year: 2021).*

*Primary Examiner* — Hung S. Bui
*Assistant Examiner* — Sagar Shrestha
(74) *Attorney, Agent, or Firm* — Oliff PLC

(57) ABSTRACT

A housing includes: a box-shaped main body portion accommodating an electronic circuit substrate and including an opening portion; a lid portion covering the opening portion so as to be able to open or close the opening portion; a jumper detachably attached to the electronic circuit substrate; a window portion different from the opening portion, the window portion being opposed to the jumper and being open at the main body portion; and a cover portion covering the window portion so as to be able to open or close the window portion.

5 Claims, 6 Drawing Sheets

(51) Int. Cl.
*H05K 5/02* (2006.01)
*H05K 5/03* (2006.01)
*H05K 7/14* (2006.01)

(56) References Cited

U.S. PATENT DOCUMENTS

| | | | | |
|---|---|---|---|---|
| 7,390,230 | B1* | 6/2008 | Chen | H01R 31/08 |
| | | | | 439/875 |
| 8,995,107 | B2* | 3/2015 | Chen | H01C 7/12 |
| | | | | 361/119 |
| 2005/0254207 | A1* | 11/2005 | Chan | H05K 1/0209 |
| | | | | 361/688 |
| 2010/0116525 | A1* | 5/2010 | Oka | H05K 1/118 |
| | | | | 174/254 |
| 2014/0092514 | A1* | 4/2014 | Chen | H01C 7/12 |
| | | | | 361/118 |
| 2014/0277770 | A1* | 9/2014 | Aljabari | H05K 13/0015 |
| | | | | 700/278 |
| 2015/0311702 | A1* | 10/2015 | Chen | H05K 1/181 |
| | | | | 361/118 |
| 2016/0352215 | A1* | 12/2016 | Momose | H05K 3/368 |
| 2017/0019985 | A1* | 1/2017 | Sugimoto | H05K 3/424 |
| 2017/0112005 | A1* | 4/2017 | Cole | H01L 24/72 |
| 2017/0364104 | A1* | 12/2017 | Poplawski | F24F 11/30 |
| 2019/0305649 | A1* | 10/2019 | Ito | H02P 27/08 |
| 2020/0008314 | A1* | 1/2020 | Kuroiwa | H05K 5/006 |
| 2021/0227684 | A1* | 7/2021 | Wang | H01P 3/08 |

FOREIGN PATENT DOCUMENTS

| | | |
|---|---|---|
| JP | 2004-153219 A | 5/2004 |
| JP | 2005-243981 A | 9/2005 |
| JP | 2010-60241 A | 3/2010 |
| JP | 2016-152201 A | 8/2016 |

* cited by examiner

[FIG.1]
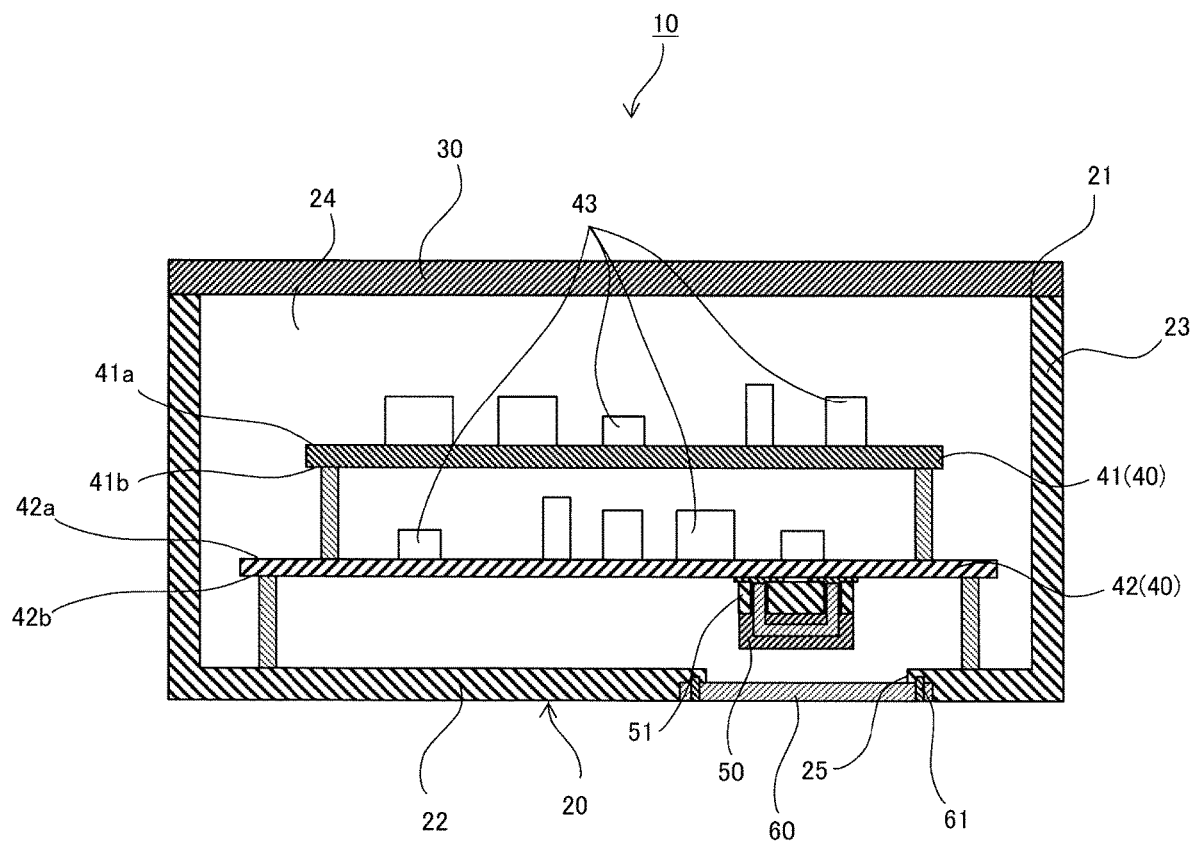

[FIG.2A]
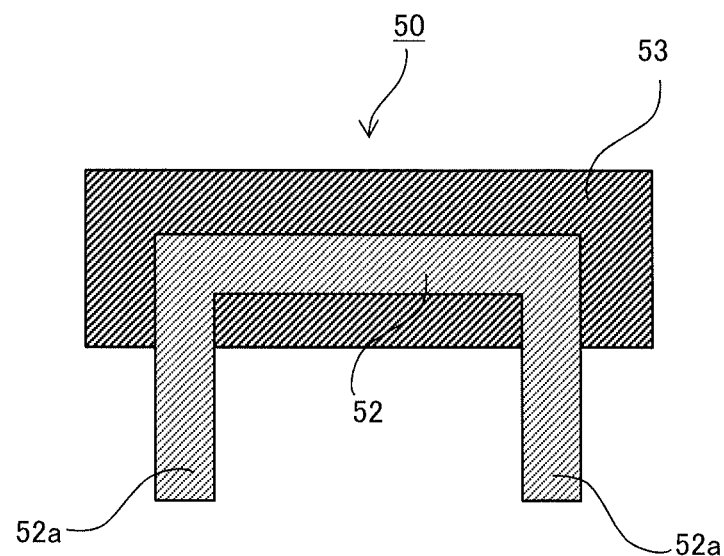
[FIG.2B]
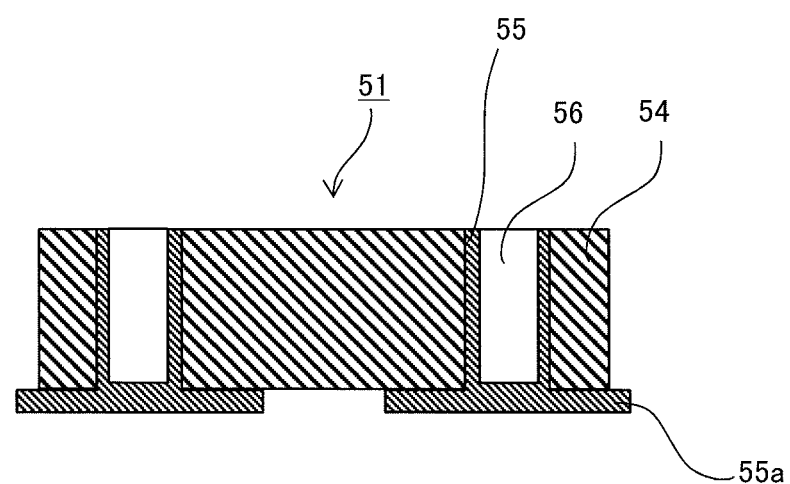

[FIG.3]
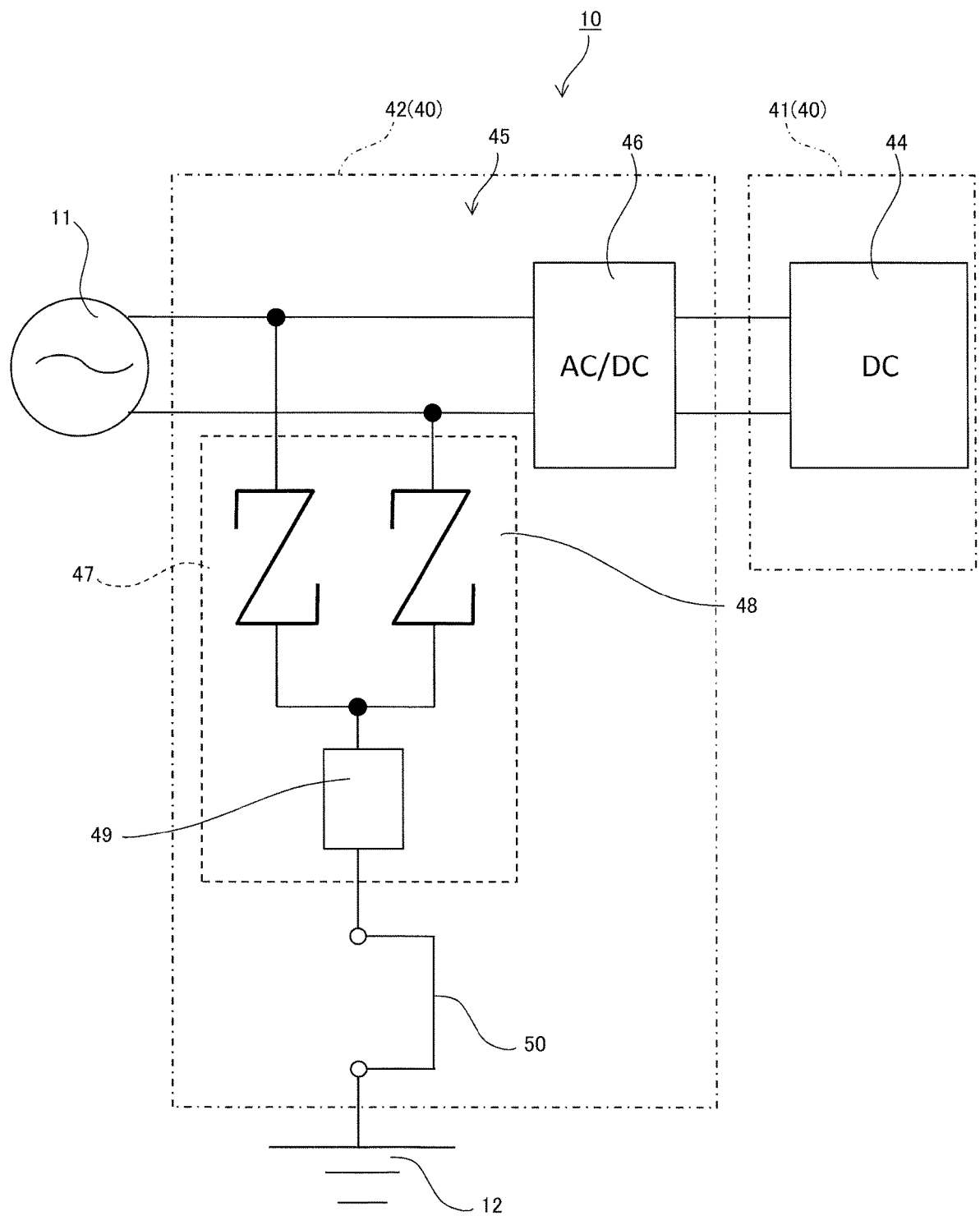

[FIG.4]
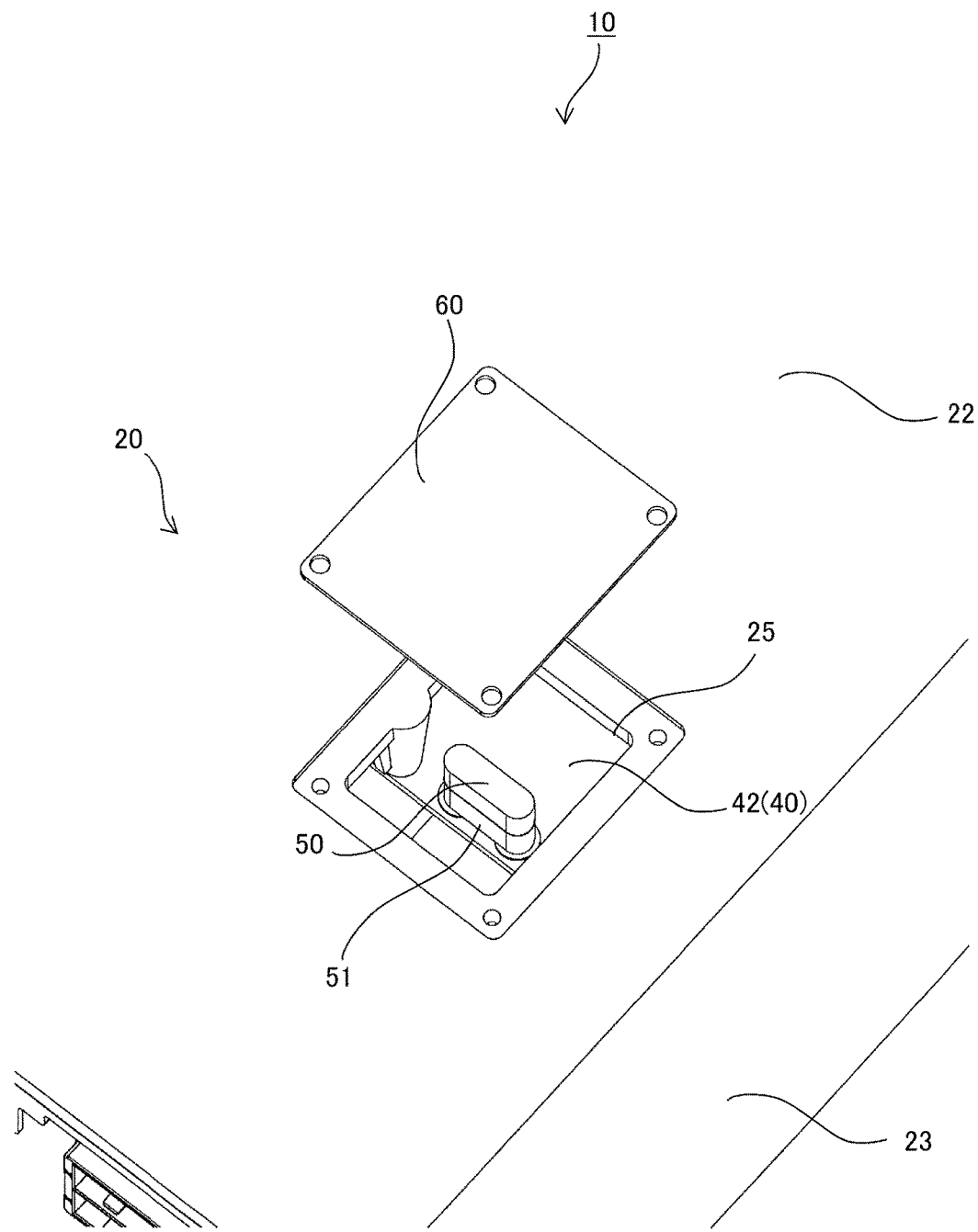

[FIG.5]
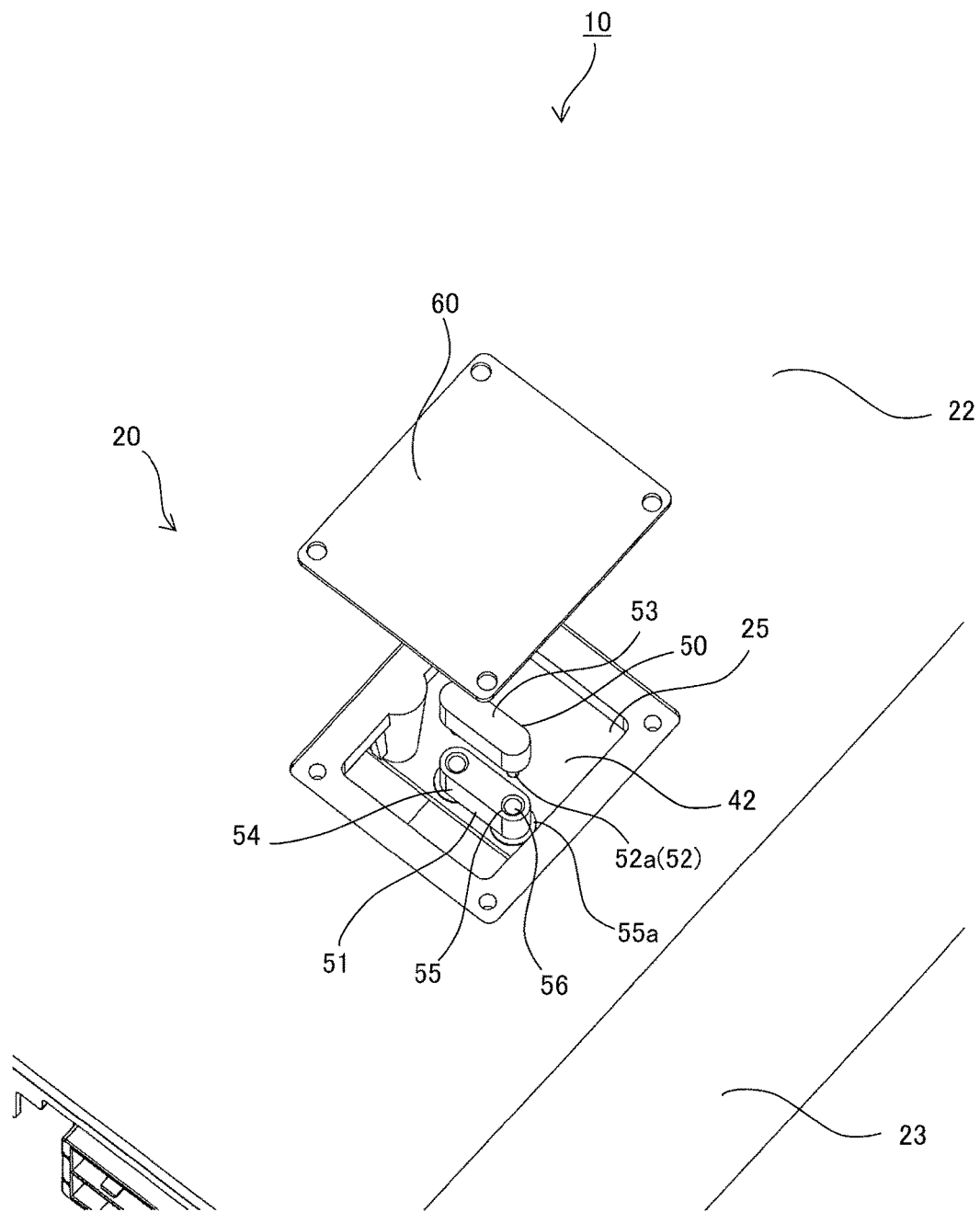

[FIG.6]
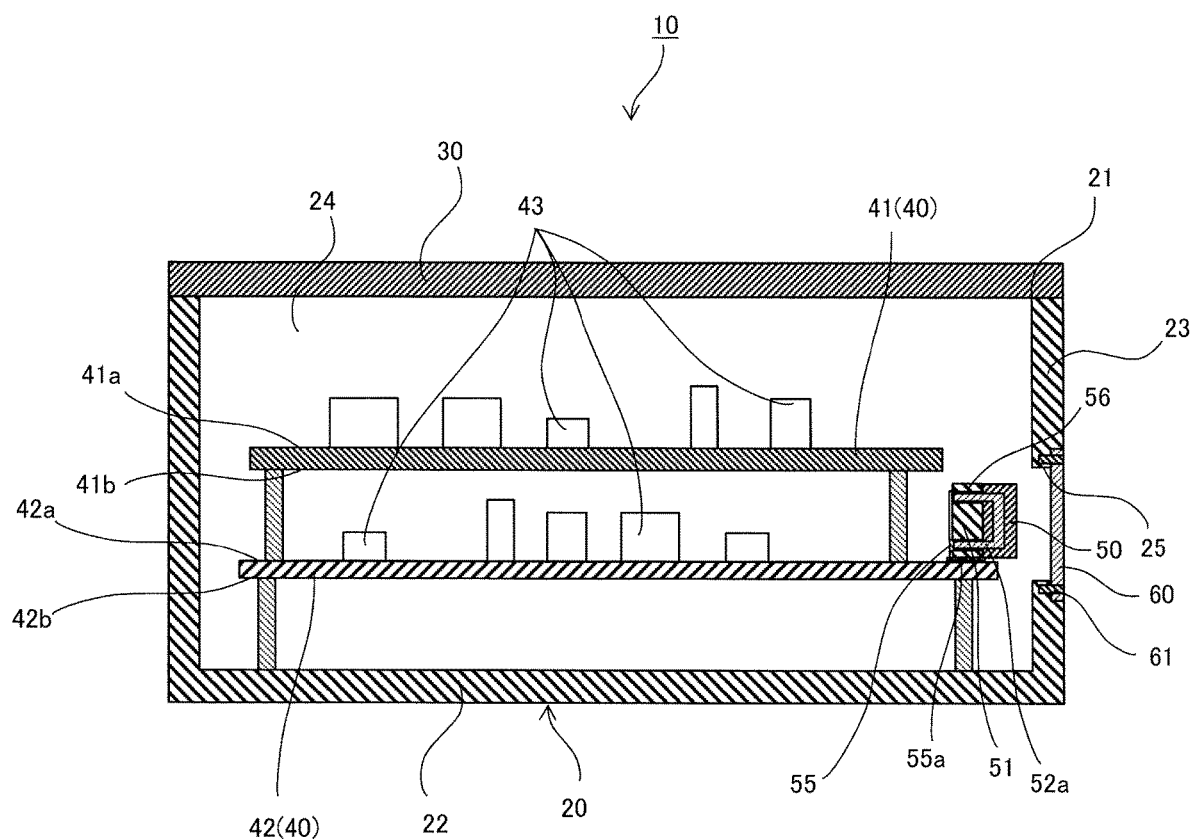

HOUSING

TECHNICAL FIELD

The present invention relates to a housing, and for example, relates to a housing accommodating an electronic circuit substrate.

BACKGROUND ART

Conventionally, a connecting terminal cover described in PTL 1 is known as a housing accommodating an electronic circuit substrate. The connecting terminal cover includes: a casing; an alternative circuit forming portion accommodated in the casing; and a lid member that opens or closes an upper opening of the casing. A plurality of inner connecting terminals are provided at the alternative circuit forming portion. The inner connecting terminals are connected to each other by a jumper member, and with this, an alternative circuit is formed.

CITATION LIST

Patent Literature

PTL 1: Japanese Laid-Open Patent Application Publication No. 2016-152201

SUMMARY OF INVENTION

Technical Problem

According to the connecting terminal cover described in PTL 1, the upper opening of the casing is opened by the lid member, and the jumper member is transferred through the upper opening into the casing and is then connected to the inner connecting terminal of the alternative circuit forming portion. However, since a large number of electronic parts are typically mounted on an electronic circuit substrate, such as the alternative circuit forming portion, it is not easy to connect the jumper member to the inner connecting terminal. Further, when attaching or detaching the jumper member, the jumper member may contact and damage peripheral electronic parts. Thus, a working property is low.

Further, when attaching or detaching the jumper member, electronic circuit substrates around the jumper member need to be detached in some cases. This requires time and labor. In addition, when reattaching the detached electronic circuit substrates to original positions, the electronic circuit substrates and wires may be assembled at inappropriate positions, and this may cause failure or malfunction. Therefore, the working property is low.

The present invention was made to solve the above problems, and an object of the present invention is to provide a housing which facilitates attaching and detaching of a jumper and improves a working property,

Solution to Problem

A housing according to an aspect of the present invention includes: a box-shaped main body portion accommodating an electronic circuit substrate and including an opening portion; a lid portion covering the opening portion so as to be able to open or close the opening portion; a jumper detachably attached to the electronic circuit substrate; a window portion different from the opening portion, the window portion being opposed to the jumper and being open at the main body portion; and a cover portion covering the window portion so as to be able to open or close the window portion.

According to this configuration, even when a large number of electronic parts are mounted on the electronic circuit substrate, the window portion is opened by detaching the cover portion, and with this, the jumper opposed to the window portion can be easily attached or detached. In addition, from the viewpoint of maintenance and the like, a large number of electronic parts are provided at the electronic circuit substrate so as to be opposed to the opening portion, but the jumper is provided at the electronic circuit substrate so as to be opposed to the window portion that is different from the opening portion. Therefore, when attaching or detaching the jumper, a user hardly contacts the other electronic parts. Further, in order to attach or detach the jumper, it is unnecessary to detach the electronic circuit substrates around the jumper and reassemble the electronic circuit substrates. Therefore, a working property regarding the housing can be improved.

In the above housing, the jumper may be attached to a surface of the electronic circuit substrate, the surface being opposite to a surface opposed to the opening portion. According to this configuration, a large number of electronic parts are arranged on the surface opposed to the opening portion, but the jumper is arranged on the surface opposite to the surface opposed to the opening portion. Therefore, when attaching or detaching the jumper, the user hardly contacts the other electronic parts. Further, in order to attach or detach the jumper, it is unnecessary to detach the electronic circuit substrates around the jumper. Therefore, the working property regarding the housing can be improved.

In the above housing, an area of the window portion may be smaller than an area of the opening portion. According to this configuration, since the window portion is small, the electronic parts around the jumper opposed to the window portion are covered with the main body portion surrounding the window portion. Therefore, when attaching or detaching the jumper, the user hardly contacts the other electronic parts. Thus, the working property regarding the housing can be improved.

In the above housing, the main body portion may accommodate a plurality of electronic circuit substrates including the electronic circuit substrate, and the jumper may be attached to the electronic circuit substrate located closest to the window portion among the plurality of electronic circuit substrates. According to this configuration, the jumper can be arranged close to the window portion, and the jumper opposed to the window portion can be easily attached or detached.

In the above housing, the electronic circuit substrate to which the jumper is attached may be a power supply substrate to which electric power is supplied from a power supply. According to this configuration, a circuit on the power supply substrate can be connected or disconnected by the jumper.

The above housing may further include a surge protection circuit provided at the electronic circuit substrate and configured to discharge surge voltage applied to the electronic circuit substrate, and the jumper may be connected between the surge protection circuit and an earth so as to be able to disconnect the surge protection circuit and the earth from each other. According to this configuration, for example, electric discharge from the surge protection circuit is prevented by detaching the jumper, and voltage higher than surge voltage is applied to the electric circuit. Thus, the withstand voltage test can be performed.

Advantageous Effects of Invention

The present invention is configured as above and has an effect of being able to provide the housing which facilitates attaching and detaching of the jumper and improves the working property.

The above object, other objects, features, and advantages of the present invention will be made clear by the following detailed explanation of preferred embodiments with reference to the attached drawings.

BRIEF DESCRIPTION OF DRAWINGS

FIG. 1 is a sectional view schematically showing a housing according to an embodiment of the present invention.

FIG. 2A is a sectional view showing a jumper of FIG. 1. FIG. 2B is a sectional view showing a socket of the jumper.

FIG. 3 is a diagram showing an electric circuit of FIG. 1.

FIG. 4 is a perspective view showing a main body portion and a cover portion when a window portion of FIG. 1 is open.

FIG. 5 is a perspective view showing the main body portion and the cover portion when the jumper is detached from a socket of FIG. 4.

FIG. 6 is a sectional view schematically showing the housing according to another embodiment of the present invention.

DESCRIPTION OF EMBODIMENTS

Hereinafter, embodiments of the present invention will be specifically described with reference to the drawings. In the following description and the drawings, the same reference signs are used for the same or corresponding components, and a repetition of the same explanation is avoided.

Configuration of Housing

As shown in FIG. 1, a housing 10 according to an embodiment includes a main body portion 20 and a lid portion 30. The main body portion 20 has a box shape including an opening portion 21 and is constituted by a bottom surface portion 22 and a side surface portion 23. An internal space 24 of the main body portion 20 is surrounded by the bottom surface portion 22 and the side surface portion 23 and accommodates electronic circuit substrates (hereinafter referred to as "substrates 40"). A jumper 50 is detachably attached to the substrate 40.

The bottom surface portion 22 is arranged so as to be opposed to the opening portion 21. The side surface portion 23 stands from the bottom surface portion 22 and surrounds the opening portion 21. A window portion 25 is open at the bottom surface portion 22. The window portion 25 is provided at the bottom surface portion 22 so as to be opposed to the jumper 50 such that the jumper 50 can be exposed to an outside. For example, since an area of the window portion 25 is smaller than an area of the opening portion 21, the main body portion 20 surrounding the window portion 25 can cover electronic parts 43 provided around the jumper 50.

A cover portion 60 is attached to the bottom surface portion 22 so as to be able to open or close the window portion 25. For example, the cover portion 60 has a plate shape and is fixed to the main body portion 20 by screws 61 or the like.

The lid portion 30 covers the opening portion 21 of the main body portion 20 so as to be able to open or close the opening portion 21 and has, for example, a plate shape. When the lid portion 30 closes the opening portion 21, the lid portion 30 is arranged so as to be opposed to the bottom surface portion 22 of the main body portion 20.

One or a plurality of (in the present embodiment, two) substrates 40 are arranged in the main body portion 20. Examples of the substrates 40 include a first substrate 41 at which a main circuit is provided and a second substrate 42 at which a power supply circuit is provided.

The first substrate 41 is arranged closer to the opening portion 21 than the second substrate 42. The first substrate 41 is arranged so as to be spaced apart from and parallel to the second substrate 42 and the lid portion 30 that closes the opening portion 21. Among the plurality of substrates 40, the second substrate 42 is the substrate 40 located farthest from the opening portion 21 and closest to the window portion 25. The second substrate 42 is arranged closer to the bottom surface portion 22 than the first substrate 41. The second substrate 42 is arranged so as to be spaced apart from and parallel to the bottom surface portion 22.

From the viewpoint of the ease of maintenance, the ease of manufacture of the wires, and the like, a large number of electronic parts 43 are mounted on surfaces (opening-side surfaces 41a and 42a) of the first and second substrates 41 and 42 which surfaces are opposed to the opening portion 21. It should be noted that the electronic parts 43 may also be mounted on surfaces (surfaces opposed to the bottom surface portion 22 and the window portion 25; window-side surfaces 41b and 42b) of the first and second substrates 41 and 42 which surfaces are opposite to the opening-side surfaces 41a and 42a. A socket 51 of the jumper 50 is provided on a surface of the second substrate 42 which surface is located close to the window portion 25.

Jumper and its Socket

As shown in FIG. 2A, the jumper 50 includes a line member 52 and a holding portion 53. The line member 52 has, for example, a U shape. Both ends of the line member 52 project from the holding portion 53 and constitute a pair of terminals 52a of the jumper 50. The holding portion 53 is a portion which can be held by a user. The holding portion 53 has a substantially rectangular solid shape and is made of resin.

As shown in FIG. 2B, the socket 51 is used to attach the jumper 50 to the substrate 40 and includes an attaching portion 54, two connecting portions 55, and two insertion holes 56. The attaching portion 54 has a substantially rectangular solid shape and is made of resin. The two connecting portions 55 are arranged at the attaching portion 54 so as to be spaced apart from each other. Each of the connecting portions 55 has, for example, a cylindrical shape, and the insertion hole 56 is formed inside the connecting portion 55. Each of terminals 55a of the connecting portions 55 projects from the attaching portion 54 and has, for example, a disc shape.

As shown in FIGS. 2A and 2B, the terminals 52a of the line member 52 of the jumper 50 are inserted into the insertion holes 56 of the connecting portions 55 of the socket 51. With this, the line member 52 and the connecting portions 55 are connected to each other. For example, when the terminals 55a of the connecting portions 55 are soldered to the power supply circuit of the second substrate 42 (FIG. 1), the jumper 50 is connected to the power supply circuit through the connecting portions 55.

Circuit

As shown in FIG. 3, the housing 10 includes, for example, a main circuit 44 and a power supply circuit 45. The main circuit 44 is, for example, a control circuit configured to control an electrical apparatus (not shown), such as a robot. The main circuit 44 is connected to the power supply circuit 45 and provided at the first substrate 41. The power supply circuit 45 can be connected to, for example, an external power supply 11. The power supply circuit 45 includes an AC/DC conversion element 46 and a surge protection circuit 47 and is provided at the second substrate 42.

The surge protection circuit 47 is a circuit configured to protect the main circuit 44 from surge voltage that is momentary overvoltage. The surge protection circuit 47 is provided at the second substrate 42. The surge protection circuit 47 is connected to the power supply 11, the main circuit 44, and the AC/DC conversion element 46 in parallel and also connected to an earth 12 in series through the jumper 50.

The surge protection circuit 47 includes, for example, a varistor 48 and a gas arrestor 49. It should be noted that the configuration of the surge protection circuit 47 is not limited to this. The varistor 48 is connected the power supply 11, and the gas arrestor 49 is connected to the varistor 48 and one of the jumper 50 and the earth 12.

Method of Using Housing

As shown in FIG. 1, when the housing 10 is typically used, the substrates 41 and 42 are accommodated in the internal space 24 of the main body portion 20, and the jumper 50 is connected to the second substrate 42. The opening portion 21 of the main body portion 20 is covered with the lid portion 30, and the window portion 25 is covered with the cover portion 60.

As shown in FIG. 3, for example, the power supply circuit 45 of the second substrate 42 converts AC voltage of 200 V, supplied from the power supply 11, into small DC voltage of 5 to 12 V and supplies the DC voltage to the main circuit 44 of the first substrate 41. With this, the main circuit 44 can control the electrical apparatus.

Further, the jumper 50 connects the surge protection circuit 47 with the earth 12. Therefore, for example, if the surge voltage of 800 V or more is applied to the power supply circuit 45 by a thunderbolt or the like, the surge current flows through the surge protection circuit 47 of the power supply circuit 45 to the earth 12, i.e., the surge current is discharged. With this, the surge voltage is not applied to the main circuit 44, and therefore, the main circuit 44 and the electrical apparatus connected to the main circuit 44 can be protected from the surge voltage.

In delivery inspection or the like of the housing 10 and the electrical apparatus in which the housing 10 is incorporated, a withstand voltage test is performed. In this case, as shown in FIG. 4, the window portion 25 is opened by detaching the cover portion 60. With this, since the window portion 25 overlaps the jumper 50 in a plan view, the jumper 50 is exposed to an outside through the window portion 25. Therefore, the user does not have to look for the jumper 50 and can easily find the jumper 50.

The jumper 50 is provided on the window-side surface 42b of the second substrate 42 which is located farthest from the opening portion 21 and closest to the window portion 25. With this, a distance between the jumper 50 and the window portion 25 is short, and a user can easily access the jumper 50 through the window portion 25. Therefore, the jumper 50 is easily attached or detached.

Further, since the window portion 25 is small, a large number of electronic parts 43 are covered with the main body portion 20. Therefore, even if voltage is being applied to the electronic parts 43 (FIG. 1), and a user's finger is being inserted into the main body through the window portion 25, the user does not unintentionally contact the electronic parts 43, and therefore, a working property regarding the housing 10 can be improved.

The jumper 50 is arranged on the window-side surface 42b of the second substrate 42, but a large number of other electronic parts 43 are arranged on the opening-side surface 42a of the second substrate 42. Therefore, from this point of view, the jumper 50 is easily found, and the jumper 50 is easily attached or detached. In addition, the jumper 50 is prevented from contacting the electronic parts 43, and the working property regarding the housing 10 is excellent.

In order to attach or detach the jumper 50, it is unnecessary to detach the electronic circuit substrates around the jumper 50. Thus, increases in work labor and time can be suppressed. Further, it is unnecessary to reattach the detached electronic circuit substrates to original positions, and therefore, failure or malfunction caused when the electronic circuit substrates and the wires connected thereto are assembled to inappropriate positions can be prevented.

As shown in FIG. 5, the user holds the holding portion 53 of the jumper 50 and pulls out the terminals 52a of the jumper 50 from the insertion holes 56 of the socket 51. With this, the surge protection circuit 47 in the power supply circuit 45 shown in FIG. 3 and the earth 12 are disconnected from each other. Then, as shown in FIG. 1, the cover portion 60 is attached to the main body portion 20, and thus, the housing 10 is set to a normal use state. Then, for example, high voltage for the withstand voltage test of 1,500 V is applied to the substrates 41 and 42 from the power supply 11 of FIG. 3. In this case, the current does not flow to the earth 12 but flows to the power supply circuit 45 and the main circuit 44. Thus, the withstand voltage test of the power supply circuit 45 and the main circuit 44 can be performed.

After the withstand voltage test, the cover portion 60 is detached again, and the jumper 50 is attached to the socket 51 through the window portion 25. With this, the surge protection circuit 47 is connected to the earth 12 through the jumper 50 and can perform its function.

Further, as shown in FIG. 5, the insertion holes 56 of the socket 51 are open toward the window portion 25 and extend in a direction perpendicular to the window portion 25. Therefore, the terminals 52a of the jumper 50 are inserted into the insertion holes 56 in the direction perpendicular to the window portion 25. With this, the jumper 50 can be easily connected to the second substrate 42 without contacting the peripheral electronic parts 43. Similarly, the terminals 52a are pulled out from the insertion holes 56 in the direction perpendicular to the window portion 25. With this, the jumper 50 can be easily detached from the second substrate 42 without contacting the peripheral electronic parts 43.

Other Embodiments

In the above configuration, the window portion 25 is provided at the bottom surface portion 22 of the main body portion 20. However, the position of the window portion 25 at the main body portion 20 is not limited to this as long as the position of the window portion 25 is opposed to the jumper 50. For example, as shown in FIG. 6, the window portion 25 may be formed at the side surface portion 23 of the main body portion 20 so as to be opposed to the jumper 50. Even in this case, the window portion 25 overlaps the jumper 50 in a plan view, and the jumper 50 can be easily attached or detached through the window portion 25.

The jumper 50 is arranged closer to the window portion 25 than the socket 51. The connecting portions 55 of the socket 51 are formed such that: the insertion holes 56 are open toward the window portion 25 and extend in the direction perpendicular to the window portion 25; and terminals 55a are connected to the second substrate 42. With this, the terminals 52a of the jumper 50 can be easily inserted into or pulled out from the insertion holes 56 in the direction perpendicular to the window portion 25.

In the above embodiment, the jumper 50 is connected to the substrate 40 through the socket 51. However, the method of connecting the jumper 50 is not limited to this as long as the jumper 50 is detachably attached to the substrate 40. For example, the jumper 50 may be directly and detachably attached to the substrate 40.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

INDUSTRIAL APPLICABILITY

The housing of the present invention is useful as, for example, a housing which facilitates attaching and detaching of a jumper and improves a working property.

REFERENCE SIGNS LIST 10 housing
12 earth
20 main body portion
21 opening portion
25 window portion
30 lid portion
40 substrate (electronic circuit substrate)
41 first substrate (electronic circuit substrate)
42 second substrate (power supply substrate, electronic circuit substrate)
47 surge protection circuit
50 jumper
60 cover portion

The invention claimed is:

1. A housing comprising:
   a box-shaped main body portion accommodating an electronic circuit substrate and including an opening portion;
   a lid portion covering the opening portion so as to be able to open or close the opening portion;
   a jumper detachably attached to the electronic circuit substrate;
   a window portion different from the opening portion, the window portion being opposed to the jumper and being open at a main body portion;
   a cover portion covering the window portion so as to be able to open or close the window portion; and
   a surge protection circuit provided at the electronic circuit substrate and configured to discharge surge voltage applied to the electronic circuit substrate, wherein:
   the jumper is connected between the surge protection circuit and an earth so as to be able to disconnect the surge protection circuit and the earth from each other; and
   in a withstand voltage test of the electronic circuit substrate, the jumper is detached from between the surge protection circuit and the earth.

2. The housing according to claim 1, wherein the jumper is attached to a surface of the electronic circuit substrate, the surface being opposite to a surface opposed to the opening portion.

3. The housing according to claim 1, wherein an area of the window portion is smaller than an area of the opening portion.

4. The housing according to claim 1, wherein:
   the main body portion accommodates a plurality of electronic circuit substrates including the electronic circuit substrate; and
   the jumper is attached to the electronic circuit substrate located closest to the window portion among the plurality of electronic circuit substrates.

5. The housing according to claim 1, wherein the electronic circuit substrate to which the jumper is attached is a power supply substrate to which electric power is supplied from a power supply.

* * * * *